(12) United States Patent
Taki

(10) Patent No.: US 7,190,001 B2
(45) Date of Patent: Mar. 13, 2007

(54) GAN BASED SEMICONDUCTOR LIGHT EMITTING DEVICE AND METHOD OF MAKING THE SAME

(75) Inventor: Tetsuya Taki, Aichi-ken (JP)

(73) Assignee: Toyoda Gosei Co., Ltd., Aichi (JP)

( * ) Notice: Subject to any disclaimer, the term of this patent is extended or adjusted under 35 U.S.C. 154(b) by 0 days.

(21) Appl. No.: 10/926,398

(22) Filed: Aug. 26, 2004

(65) Prior Publication Data

US 2005/0056850 A1    Mar. 17, 2005

(30) Foreign Application Priority Data

Sep. 17, 2003    (JP) .............................. 2003-324571

(51) Int. Cl.
*H01L 27/15* (2006.01)
(52) U.S. Cl. ..................... 257/79; 257/13; 257/94; 257/103
(58) Field of Classification Search ............... None
See application file for complete search history.

(56) References Cited

U.S. PATENT DOCUMENTS 5,760,426 A * 6/1998 Marx et al. ................. 257/190
6,326,638 B1 * 12/2001 Kamiyama et al. ........... 257/13
6,927,164 B2 * 8/2005 Biwa et al. .................. 438/674

FOREIGN PATENT DOCUMENTS

JP    10-215029    8/1998

* cited by examiner

*Primary Examiner*—Wai-Sing Louie
(74) *Attorney, Agent, or Firm*—McGinn IP Law Group, PLLC

(57) ABSTRACT

A GaN based semiconductor light emitting device has: an active layer disposed between an n-type layer and a p-type layer; and a polycrystalline nitride based semiconductor uneven layer disposed between the n-type layer and the active layer. The active layer is formed uneven according to the uneven form of the polycrystalline nitride based semiconductor uneven layer.

20 Claims, 3 Drawing Sheets

GAN BASED SEMICONDUCTOR LIGHT EMITTING DEVICE AND METHOD OF MAKING THE SAME

The present application is based on Japanese patent application No. 2003-324571, the entire contents of which are incorporated herein by reference.

BACKGROUND OF THE INVENTION

1. Field of the Invention

The invention relates to a GaN based semiconductor light emitting device, and particularly relates to a GaN based semiconductor light emitting device that the emission efficiency can be increased, and a method of making the same.

2. Description of the Related Art

Japanese patent application laid-open No. 10-215029 discloses a GaN based semiconductor light emitting device that is provided with: a thin film layer that is formed uneven on a nitride semiconductor layer under the conditions that the lattice constant mismatch of the thin film layer to the nitride semiconductor layer is ±3% or greater and the thickness of the thin film layer is 50 Å or less; and an active layer that is of nitride semiconductor including indium. In this structure, the active layer is provided with In(indium)-poor region and In-rich region due to being formed uneven. It is therein stated that the active layer has a quantum dot effect or quantum box effect and thereby, the emission efficiency can be increased.

Thus, the uneven thin film layer has to be formed under the limited growth conditions.

SUMMARY OF THE INVENTION

It is an object of the invention to provide a GaN based semiconductor light emitting device that has increased emission efficiency.

It is a further object of the invention to provide a method of making the GaN based semiconductor light emitting device that has increased emission efficiency, under simplified growth conditions.

According to a first aspect of the invention, a GaN based semiconductor light emitting device comprises:

an active layer disposed between an n-type layer and a p-type layer; and a polycrystalline nitride based semiconductor uneven layer disposed between the n-type layer and the active layer, wherein the active layer is formed uneven according to the uneven form of the polycrystalline nitride based semiconductor uneven layer.

According to a second aspect of the invention, a GaN based semiconductor light emitting device comprises:

an active layer disposed between an n-type layer and a p-type layer; and an AlN uneven layer disposed between the n-type layer and the active layer, wherein the active layer is formed uneven according to the uneven form of the AlN uneven layer.

According to a third aspect of the invention, a method of making a GaN based semiconductor light emitting device comprises the steps of:

forming an n-type GaN based semiconductor layer on a substrate;

forming an amorphous nitride based semiconductor layer at a predetermined temperature;

thermally treating the amorphous nitride based semiconductor layer at a temperature higher than the predetermined temperature to form a polycrystalline nitride semiconductor uneven layer;

forming an active layer on the polycrystalline nitride semiconductor uneven layer; and forming a p-type GaN based semiconductor layer on the active layer.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
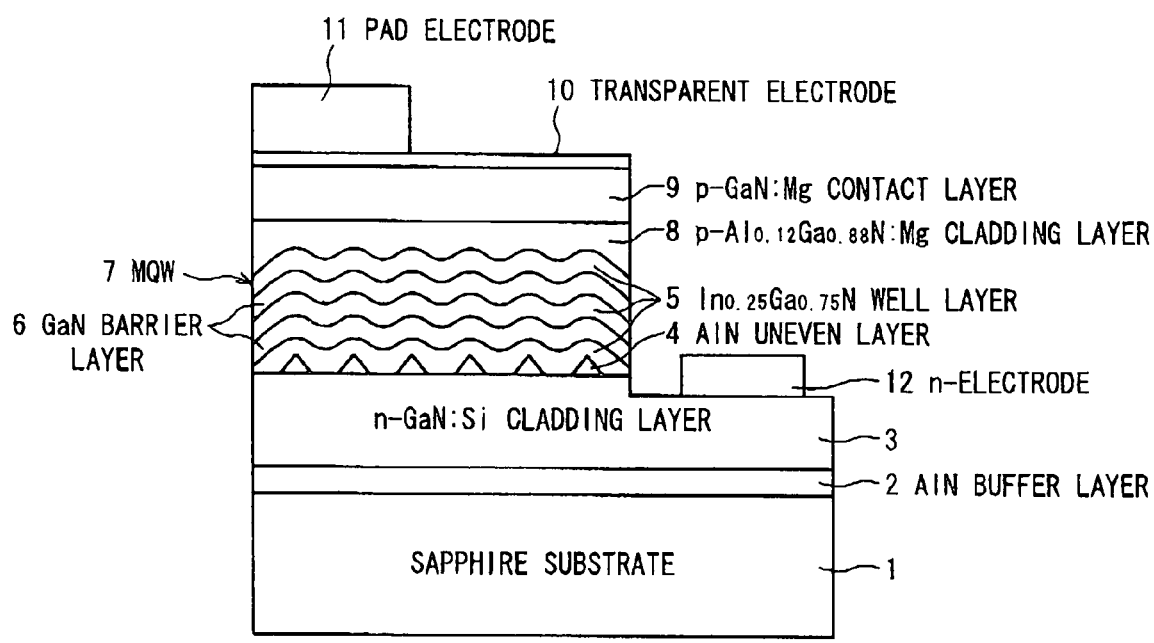
FIG. 1 is a schematic cross sectional view showing a GaN based semiconductor light emitting device in a preferred embodiment according to the invention.

FIG. 1 is a schematic cross sectional view showing a GaN based semiconductor light emitting device in the preferred embodiment according to the invention.

In the GaN based semiconductor light emitting device, an AlN buffer layer 2 is formed on a sapphire substrate 1 in low temperature growth. On the buffer layer 2, n-type GaN:Si-doped cladding layer (which also functions as a contact layer) 3 is formed. On the n-GaN cladding layer 3, the AlN uneven layer 4 is formed. On the AlN uneven layer 4, MQW (=multiquantum well structure) 7 is formed that is provided with three uneven-formed $In_{0.25}Ga_{0.75}N$ well layers 5 and two uneven-formed GaN barrier layers 6 which are alternately disposed. On the MQW 7, a Mg-doped p-type $Al_{0.12}Ga_{0.88}N$ cladding layer 8 is formed. On the p-cladding layer 8, a M-doped p-type GaN contact layer 9 is formed. By etching part of the p-GaN contact layer 9, p-$Al_{0.12}Ga_{0.88}N$ cladding layer 8, MQW 7 and n-GaN cladding layer 3, a partial surface of the n-GaN cladding layer 3 is exposed. An n-type electrode 12 is formed on the exposed surface. On the surface of p-GaN contact layer 9, a transparent electrode 10 and a pad electrode 11 are formed.

In the above structure, when a forward voltage is applied through bonding wires (not shown) bonded onto the pad electrode 11 and n-electrode 12, holes and electrons as carriers are recombined in the $In_{0.25}Ga_{0.75}N$ well layers 5 to emit light, and the emitted light is externally radiated through the transparent electrode 10.

Since the $In_{0.25}Ga_{0.75}N$ well layers 5 are formed uneven, they can have a nonuniformity in composition and an enlarged surface area. Thereby, the emission efficiency can be increased.

Figure 2A:
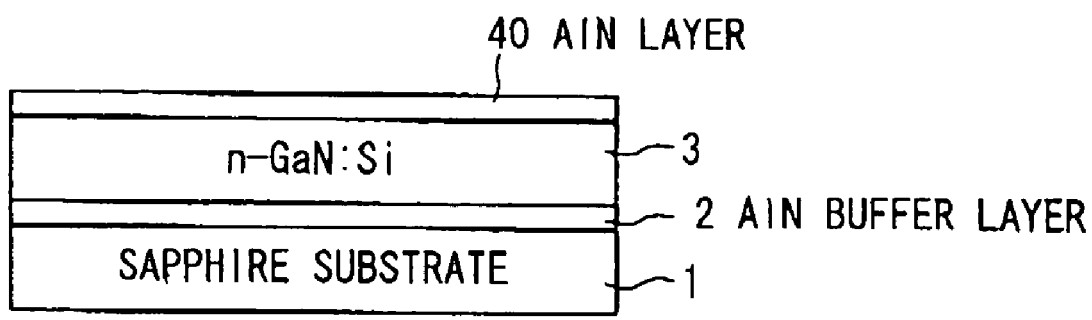
FIG. 2A is a schematic cross sectional view showing an AlN layer 40 formed prior to forming an AlN uneven layer 4 in FIG. 1.
Figure 2B:
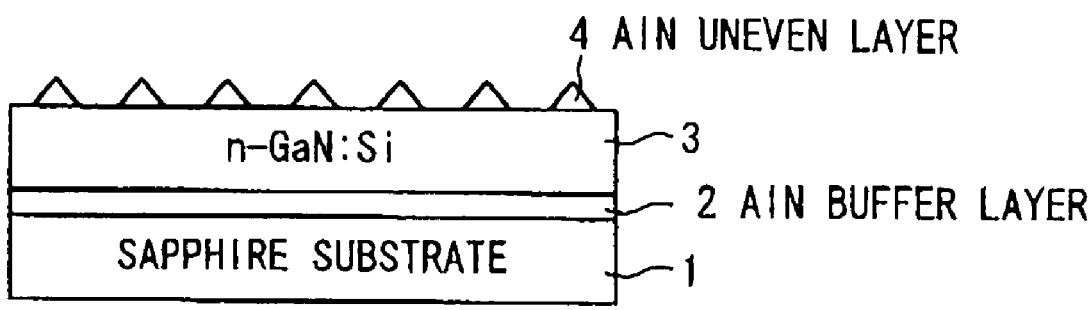
FIG. 2B is a schematic cross sectional view showing the AlN uneven layer 4 being formed uneven.

Referring to FIGS. 1 and 2A–2B, the method of making a GaN based semiconductor light emitting device in the preferred embodiment of the invention will be explained below.

The sapphire substrate 1 with a crystal growth surface on (0001) face is washed using organic solvent, and then is placed on a susceptor of growth furnace in a MOCVD apparatus. The growth furnace is evacuated and then is heated to about 1200% while supplying hydrogen. Thereby, hydrocarbon gas adsorbed to the surface of the sapphire substrate 1 can be removed to some extent.

Then, the sapphire substrate 1 is cooled to about 600° C., and the AlN buffer layer 2 with a thickness of about 50 nm is formed on the sapphire substrate 1 in low temperature growth while supplying TMA (trimethyl aluminum) and $NH_3$ (ammonium).

Then, the supply of TMA is stopped and the substrate temperature is raised to 1000° C. The n-GaN:Si cladding layer (contact layer) 3 with a carrier concentration of $5 \times 10^{18}$/ $cm^3$ is grown while supplying $NH_3$, TMG (trimethyl gallium) and $SiH_4$ (silane).

Then, the sapphire substrate 1 is cooled to about 400° C., and the AlN layer 40 with a thickness of about 10 Å is formed on the n-type GaN cladding layer 3 while supplying TMA and $NH_3$ for about 10 sec. (FIG. 2A).

Then, the supply of source gas is stopped and the temperature of sapphire substrate 1 is raised to about 830° C. Thus, the AlN layer 40 is coalesced by the thermal treatment and the AlN uneven layer 4 is formed (FIG. 2B).

Then, the temperature of sapphire substrate 1 is raised to about 700° C., and the $In_{0.25}Ga_{0.75}N$ well layer 5 with a thickness of 30 Å is formed supplying $NH_3$, TMG and TMI (trimethyl indium). The $In_{0.25}Ga_{0.75}N$ well layer 5 is grown uneven according to the form of AlN uneven layer 4.

Then, the temperature of sapphire substrate 1 is raised to 880° C., and the GaN barrier layer 6 with a thickness of 170 Å is grown. The GaN barrier layer 6 is grown uneven according to the uneven surface of $In_{0.25}Ga_{0.75}N$ well layer 5.

Subsequently, two $In_{0.25}Ga_{0.75}N$ well layers 5 and one GaN barrier layer 6 are alternately grown according to the abovementioned growth conditions of $In_{0.25}Ga_{0.75}N$ well layer 5 and GaN barrier layer 6. Thus, the MQW 7 composed of, each in total, three $In_{0.25}Ga_{0.75}N$ well layers 5 and two GaN barrier layers 6 is formed. As shown in FIG. 1, the MQW 7 is formed uneven as a whole.

Then, the temperature of sapphire substrate 1 is raised to 1000° C., and the Mg-doped p-type $Al_{0.12}Ga_{0.88}N$ cladding layer with a thickness of 200 Å is grown supplying TMA, TMG, $NH_3$ and $Cp_2Mg$ (biscyclopentadienyl magnesium).

Then, the temperature of sapphire substrate 1 is kept at 1000° C., and the Mg-doped p-type GaN contact layer 9 is grown supplying TMG, $NH_3$ and $Cp_2Mg$.

Then, using a given etchant, part of the p-type GaN contact layer 9, p-type AlGaN cladding layer 8, MQW 7 and n-type GaN:Si cladding layer 3 is removed to expose the partial surface of n-type GaN:Si cladding layer 3.

Then, the transparent electrode 10 and pad electrode 11 are formed on the p-type GaN contact layer 9, and the n-type electrode 12 is formed on the n-type GaN:Si cladding layer 3.

The GaN based semiconductor light emitting device thus made by the above growth process is provided with the uneven-formed $In_{0.25}Ga_{0.75}N$ well layer 5 that allows the nonuniformity in composition and the enlarged surface area. As a result, the emission efficiency can be increased.

Figure 3:
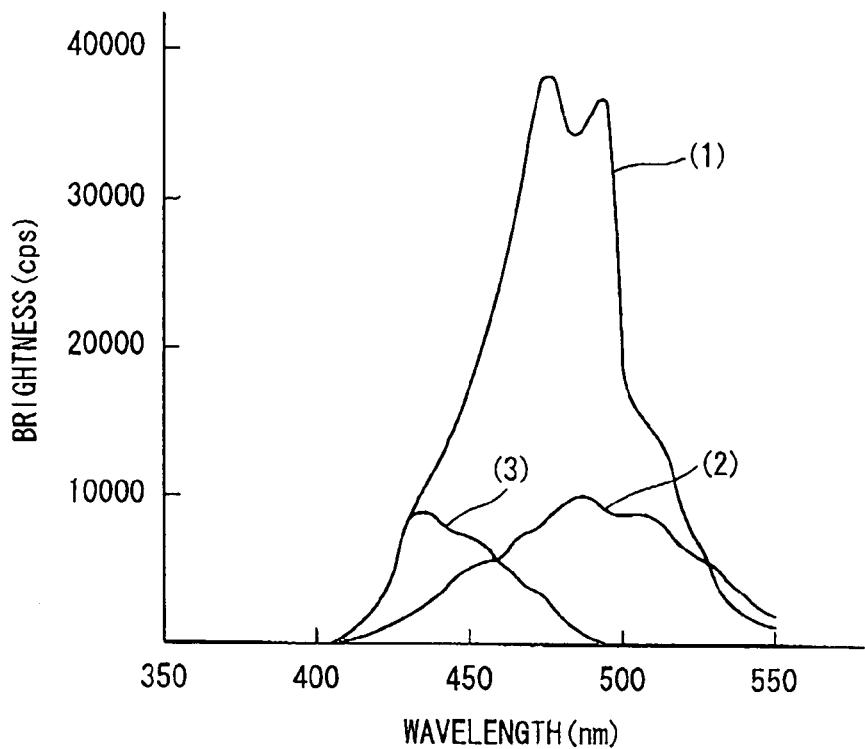
FIG. 3 is a graph showing wavelength-brightness characteristics in GaN based semiconductor light emitting devices of the invention and prior art.

FIG. 3 is a graph showing wavelength-brightness characteristics in GaN based semiconductor light emitting devices of the invention and prior art.

In FIG. 3, curve (1) indicates a wavelength-brightness characteristic of GaN based semiconductor light emitting device in the embodiment, where the AlN layer 40 is grown under the conditions of growth temperature of 400° C. and growth time of 10 sec. and the AlN uneven layer 4 is formed by thermal treatment at 830° C.

Curve (2) indicates a wavelength-brightness characteristic of GaN based semiconductor light emitting device in another embodiment, where the AlN layer 40 is grown under the conditions of growth temperature of 400° C. and growth time of 15 sec. and the AlN uneven layer 4 is formed by thermal treatment at 830° C.

Curve (3) indicates a wavelength-brightness characteristic of GaN based semiconductor light emitting device in prior art, where the AlN uneven layer 4 is not formed. The brightness of curve (3) is shown being enlarged tenfold.

In comparison with curve (3), it is proved that the GaN based semiconductor light emitting device of the embodiments according to the invention has significantly increased emission efficiency as shown in curves (1) and (2).

The AlN uneven layer 4 thus conductive to the increased emission efficiency only has to be grown using the thermal treatment in addition to the regular growth process. In other words, it does not need the etching process to be inserted in the growth step of semiconductor layers in prior art as described earlier. Thus, the method of the invention can be simplified in fabrication process.

Figure 4:
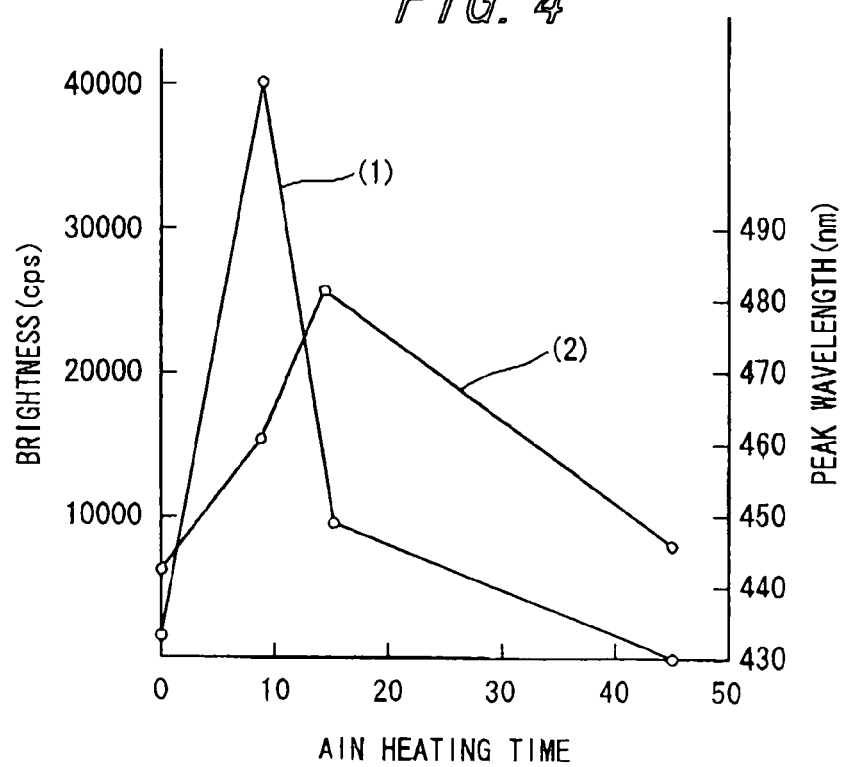
FIG. 4 is a graph showing relationships between AlN heating time and brightness and between AlN heating time and peak wavelength in the GaN based semiconductor light emitting devices of the invention.

FIG. 4 is a graph showing a relationship (curve (1)) between AlN heating time and brightness and a relationship (curve (2)) between AlN heating time and peak wavelength in the GaN based semiconductor light emitting devices of the invention.

As seen from FIG. 4, it is desirable that the thermal treatment to the AlN layer 40 to produce the AlN uneven layer 4 is conducted for about 2 to 15 sec. since the brightness increases in the time region, while having a peak value at around 10 sec. In other words, it is not desirable the thermal treatment is conducted outside the time region since the brightness lowers there. On the other hand, the peak wavelength is shifted to the longest, 480 nm, at the heating time of about 15 sec. and it is otherwise shifted to shorter side, e.g., 460 nm at about 10 sec. Thus, the brightness and peak wavelength can be arbitrarily controlled by the AlN heating time.

Although in the above embodiment the AlN uneven layer 4 is of AlN, it may be of AlGaN, GaN, InGaN or InN.

Although in the above embodiment the uneven portions of AlN uneven layer 4 are formed dispersed in a dotted pattern, they may be formed communicated each other at the bottom.

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

What is claimed is:

1. A GaN based semiconductor light emitting device, comprising:
    an active layer disposed between an n-type layer and a p-type layer; and
    a polycrystalline nitride based semiconductor discontinuous layer disposed between the n-type layer and the active layer,
    wherein the active layer is formed according to the uneven discontinuous form of the polycrystalline nitride based semiconductor discontinuous layer.

2. The GaN based semiconductor light emitting device according to claim 1, wherein:
the polycrystalline nitride based semiconductor discontinuous layer is formed by thermally treating an amorphous nitride based semiconductor layer.

3. The GaN based semiconductor light emitting device according to claim 2, wherein:
the amorphous nitride based semiconductor layer includes at least one of AlN, AlGaN, GaN, InGaN and InN.

4. The GaN based semiconductor light emitting device according to claim 1, wherein:
the active layer includes a multiquantum well structure that includes a plurality of InGaN well layers.

5. A GaN based semiconductor light emitting device, comprising:
an active layer disposed between an n-type layer and a p-type layer; and
an AlN discontinuous uneven layer disposed between the n-type layer and the active layer,
wherein the active layer is formed uneven according to the discontinuous form of the AlN discontinuous uneven layer.

6. The GaN based semiconductor light emitting device according to claim 5, wherein:
the active layer includes a multiquantum well structure that includes a plurality of InGaN well layers.

7. The GaN based semiconductor light emitting device according to claim 1, wherein the active layer includes:
a plurality of uneven InGaN well layers which are alternately disposed with a plurality of uneven GaN barrier layers.

8. The GaN based semiconductor light emitting device according to claim 7, wherein each of the plurality of uneven InGaN well layers is unevenly formed according to the polycrystalline nitride based semiconductor discontinuous layer.

9. The GaN based semiconductor light emitting device according to claim 7, wherein each of the plurality of uneven GaN barrier layers is unevenly formed according to the polycrystalline nitride based semiconductor discontinuous layer.

10. The GaN based semiconductor light emitting device according to claim 1, wherein the n-type layer includes:
an n-type GaN:Si-doped cladding layer.

11. The GaN based semiconductor light emitting device according to claim 1, wherein the p-type layer includes:
an Mg-doped p-type AlGaN cladding layer disposed on the active layer.

12. The GaN based semiconductor light emitting device according to claim 1, wherein the polycrystalline nitride based semiconductor discontinuous layer includes at least one of polycrystalline AlN, polycrystalline AlGaN, polycrystalline GaN, polycrystalline InGaN and polycrystalline InN.

13. A GaN based semiconductor light emitting device, comprising:
an n-type layer;
an polycrystalline nitride based semiconductor discontinuous layer disposed on the n-type layer;
an uneven active layer disposed on the polycrystalline nitride based semiconductor discontinuous layer; and
a p-type layer disposed on the active layer,
wherein a form of the uneven active layer corresponds to a form of the polycrystalline nitride based semiconductor discontinuous layer.

14. The GaN based semiconductor light emitting device according to claim 13, wherein the uneven active layer includes:
a plurality of uneven InGaN well layers which are alternately disposed with a plurality of uneven GaN barrier layers.

15. The GaN based semiconductor light emitting device according to claim 14, wherein each of the plurality of uneven InGaN well layers is unevenly formed according to the polycrystalline nitride based semiconductor discontinuous layer.

16. The GaN based semiconductor light emitting device according to claim 14, wherein each of the plurality, of uneven GaN barrier layers is unevenly formed according to the polycrystalline nitride based semiconductor discontinuous layer.

17. The GaN based semiconductor light emitting device according to claim 13, wherein the n-type layer includes:
an n-type GaN:Si-doped cladding layer.

18. The GaN based semiconductor light emitting device according to claim 13, wherein the p-type layer includes:
an Mg-doped p-type AlGaN cladding layer disposed on the active layer.

19. The GaN based semiconductor light emitting device according to claim 1, wherein the active layer includes a multiquantum well structure that includes a plurality of InGaN well layers,
wherein the n-type layer includes an n-type GaN:Si-doped cladding layer, and
wherein the p-type layer includes an Mg-doped p-type AlGaN cladding layer disposed on the active layer.

20. The GaN based semiconductor light emitting device according to claim 13, wherein the uneven active layer includes a plurality of uneven InGaN well layers which are alternately disposed with a plurality of uneven GaN barrier layers,
wherein the n-type layer includes an n-type GaN:Si-doped cladding layer, and
wherein the p-type layer includes an Mg-doped p-type AlGaN cladding layer disposed on the active layer.

* * * * *